United States Patent
Cole et al.

(10) Patent No.: US 7,457,033 B2
(45) Date of Patent: Nov. 25, 2008

(54) MEMS TUNABLE VERTICAL-CAVITY SEMICONDUCTOR OPTICAL AMPLIFIER

(75) Inventors: Garrett D. Cole, Santa Barbara, CA (US); E. Staffan Björlin, Studio City, CA (US); Qi Chen, Goleta, CA (US); Noel C. MacDonald, Santa Barbara, CA (US); John E. Bowers, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/442,100

(22) Filed: May 26, 2006

(65) Prior Publication Data

US 2006/0268398 A1 Nov. 30, 2006

Related U.S. Application Data

(60) Provisional application No. 60/685,293, filed on May 27, 2005.

(51) Int. Cl.
*H01S 5/00* (2006.01)
*H01S 3/086* (2006.01)
*H01S 3/16* (2006.01)
*H01S 5/187* (2006.01)
*H01S 5/343* (2006.01)

(52) U.S. Cl. ............... 359/344; 359/333; 372/50.1; 372/50.11; 372/50.124

(58) Field of Classification Search ............ 359/333, 359/344, 230–231, 579; 372/50.1, 50.11, 372/50.124
See application file for complete search history.

(56) References Cited

U.S. PATENT DOCUMENTS

| | | | | |
|---|---|---|---|---|
| 6,249,373 B1* | 6/2001 | Woodward | .......... | 359/344 |
| 6,339,496 B1* | 1/2002 | Koley et al. | .......... | 359/344 |
| 6,463,085 B1* | 10/2002 | Tayebati | .......... | 372/20 |
| 6,570,893 B1* | 5/2003 | Libatique et al. | .......... | 372/20 |
| 6,765,715 B1* | 7/2004 | DiJaili et al. | .......... | 359/344 |
| 6,813,053 B1* | 11/2004 | Chase et al. | .......... | 359/223 |
| 6,865,195 B2* | 3/2005 | Jacquet | .......... | 372/20 |
| 6,950,233 B1* | 9/2005 | DiJaili et al. | .......... | 359/344 |
| 7,027,472 B2* | 4/2006 | Flanders | .......... | 372/26 |
| 2002/0071169 A1* | 6/2002 | Bowers et al. | .......... | 359/291 |
| 2002/0074621 A1* | 6/2002 | Cheng et al. | .......... | 257/532 |
| 2002/0089044 A1* | 7/2002 | Simmons et al. | .......... | 257/668 |

OTHER PUBLICATIONS

Guan, Yan, "Design, Modeling, Analysis, Fabrication, and testing of MEM-mirrors for tunable VCSELS", Ph. D. dissertation, University of Denver (Nov. 2003).*
Ball, R. "VCSELS are tunable over 30nm range", Electronics Weekly, p. 7, (Apr. 14, 2004).*

(Continued)

*Primary Examiner*—Eric Bolda
(74) *Attorney, Agent, or Firm*—Gates & Cooper LLP (57) ABSTRACT

A MEMS-tunable semiconductor optical amplifier (SOA). A device in accordance with the present invention comprises a substrate, a first mirror, coupled to the substrate, a second mirror, an active region, coupled between the first and second mirror, and a microelectromechanical actuator, coupled to the second mirror, wherein a voltage is applied to the microelectromechanical actuator to tune the SOA.

18 Claims, 8 Drawing Sheets

OTHER PUBLICATIONS

Yu, R.-C., "Tunable Lasers:Enabling Next Generation Optical Networks", Fiberopticl Product News, pp. 28, 30, 32-33. (Feb. 2002).*

Chen et al., "First demonstration of a MEMS tunable vertical-cavity SOA", IEEE Photonics Technology Letters, vol. 16, No. 6, pp. 1438-1440 (Jun. 2004).*

G. Cole et al., "MEMS-Tunable Vertical-Cavity SOAs," *IEEE Journal of Quantum Electronics*, vol. 41, No. 3, Mar. 2005.

Q. Chen et al., "First Demonstration of a MEMS Tunable Vertical-Cavity SOA," *IEEE Photonics Technology Letters*, vol. 16, No. 6, Jun. 2004.

"MEMS enhance SOA tuning range," R&D Highlights, Fibers.org, Dec. 2004.

"Light Booster," Prototype, *Technology Review*, Sep. 2004.

"MEMS make SOAs tune farther and faster," Fibers.org, Aug. 17, 2004.

E. Bjorlin et al. "Carrier-Confined Vertical-cavity Semiconductor Optical Amplifiers for Higher Gain and Efficiency," *IEEE Journal of Selected Topics in Quantum Electronics*, vol. 9, No. 5, Sep./Oct. 2003.

G. Cole et al., "Widely Tunable Bottom-Emitting Vertical-Cavity SOAs," *IEEE Photonics Technology Letters*, vol. 17, No. 12, Dec. 2005.

* cited by examiner

MEMS TUNABLE VERTICAL-CAVITY SEMICONDUCTOR OPTICAL AMPLIFIER

CROSS-REFERENCE TO RELATED APPLICATIONS

This application claims the benefit under 35 U.S.C. Section 119(e) of commonly-assigned U.S. provisional patent application, Ser. No. 60/685,293, filed May 27, 2005, entitled "MEMS TUNABLE VERTICAL CAVITY SEMICONDUCTOR OPTICAL AMPLIFIER," by Garrett D. Cole et al., which application is incorporated by reference herein.

BACKGROUND OF THE INVENTION

1. Field of the Invention

The present invention relates to semiconductor devices, and particularly to a microelectromechanical systems (MEMS) tunable vertical-cavity semiconductor optical amplifier.

2. Description of the Related Art

Telecommunications has become a part of everyday life. The use of radio frequencies to transmit cellular telephone calls, satellites to deliver television and data service, and the use of wires to transmit voice, data, and video has become commonplace. Many of these systems, at some point, rely on optical fibers to deliver the data, since a single optical fiber can carry many times the data as a single copper wire. To deliver the data, optical amplifiers are required to transmit and amplify the data through the optical fibers in such communications systems.

However, optical amplifiers are typically expensive devices, and are also typically designed to work in specific wavelength regions. These amplifiers, if tunable at all, are not tunable over a very large range, and thus, multiple amplifiers are required for a given installation, driving up costs. Wavelength Division Multiplexing (WDM) networks are optical networks where multiple wavelengths are used. However, in addition to optical amplification, WDM systems require some form of tunable filters for channel selection and reconfigurability.

Long-wavelength vertical-cavity semiconductor optical amplifiers (VCSOAs) are attractive as a low-cost alternative to erbium-doped fiber amplifiers (EDFAs) and conventional in-plane SOAs for use in fiber-optic communications systems. However, the VCSOAs that are typically available are not tunable, and thus, even though VCSOAs are less expensive, multiple VCSOAs are still required for a given installation. A tunable VCSOA can act as a tunable filter, with the added benefit of optical gain, which allows the device to make up for its own insertion loss.

It can be seen, then, that there is a need in the art for tunable optical amplifiers. It can also be seen that there is a need in the art for a tunable VCSOA which can reduce system costs.

SUMMARY OF THE INVENTION

To minimize the limitations in the prior art, and to minimize other limitations that will become apparent upon reading and understanding the present specification, the present invention discloses methods and apparatuses for tuning a VCSOA using a MEMS device.

A tunable semiconductor optical amplifier (SOA) in accordance with the present invention comprises a substrate, a first mirror, coupled to the substrate, a second mirror, an active region, coupled between the first and second mirror, and a microelectromechanical actuator, coupled to the second mirror, wherein a voltage is applied to the microelectromechanical actuator to tune the SOA.

The tunable SOA can also include an optical output of the tunable SOA from the substrate or from the second mirror, a stiffener, coupled to the microelectromechanical actuator, for creating a uniform static state of the tunable SOA, and the substrate can be made of gallium arsenide or other semiconductor materials.

An alternative device in accordance with the present invention comprises a substrate, a first mirror, coupled to the substrate, an active region coupled to the first mirror, at least one layer of a second mirror coupled to the active region, a microelectromechanical actuator, coupled to the at least one layer, and a remainder of the second mirror, coupled to the microelectromechanical actuator, wherein a voltage is applied to the microelectromechanical actuator to move the remainder of the second mirror and tune the SOA.

The alternative tunable SOA can also include an optical output of the tunable SOA from the substrate or from the second mirror, a stiffener, coupled to the microelectromechanical actuator, for creating a uniform static state of the tunable SOA, and the substrate can be made of gallium arsenide or other semiconductor materials.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention is a tunable VCSOA which is tunable over a wide wavelength range. The device uses an integrated MEMS actuator to tune the amplifier by changing the distance between the upper Distributed Bragg Reflector (DBR)

mirror stack and the lower DBR mirror stack, which changes the resonant wavelength that the cavity will produce.

A VCSOA is an amplifier that has an inherent filter capability. VCSOAs are capable of simultaneous amplification and spectral filtering of an input optical signal. By adding a tuning capability, via the MEMS actuator, the resultant tunable VCSOA can be used in a reconfigurable optical network, which will allow for expansion of such a network without replacing the amplifier elements. Further, tunable VCSOAs are useful in large networks, such as metro-area networks, as well as in fiber-to-the-home (also known as fiber-to-the-premises) applications.

Vertical-Cavity Semiconductor Optical Amplifiers

Semiconductor Optical Amplifiers (SOAs) are typically made as in-plane devices. However, an alternative to a conventional in-plane SOAs is a vertical-cavity SOA. The vertical-cavity design gives VCSOAs a number of advantages over in-plane devices, such as high coupling efficiencies to optical fiber, small form factors, lower power consumption, potential to fabricate two-dimensional arrays, ability to test devices on the wafer without the need for cleaving, compatibility with low-cost manufacturing and packaging techniques, and amplification at any desired wavelength through alteration of the active material composition.

Tunable VCSOAs

The MEMS-enabled wavelength tuning engineered into devices in accordance with the present invention represents a significant advance in VCSOA performance. As with any Fabry-Pérot amplifier, VCSOAs possess a narrow gain bandwidth, allowing for channel selective amplification. Through the addition of the MEMS-based tuning mechanism, tunable VCSOAs can be precisely adjusted to match the wavelength of the input signal, allowing for higher gain at the desired signal wavelength. Furthermore, the MEMS-based tuning implemented in the device of the present invention allows for tuning ranges greater than those that can be achieved by other techniques such as refractive index modulation (temperature tuning). Finally, because of the inherent filtering properties of the device, tunable VCSOAs can be used as wavelength selective filters in multi-wavelength communication systems, with the added benefit of signal gain.

Applications

VCOSAs can potentially be used in any application where a compact, low-cost, single channel amplifier is needed, including: amplifying tunable filters, switches, detectors, and modulators, preamplifiers or buses.

Device Design

Figure 1:
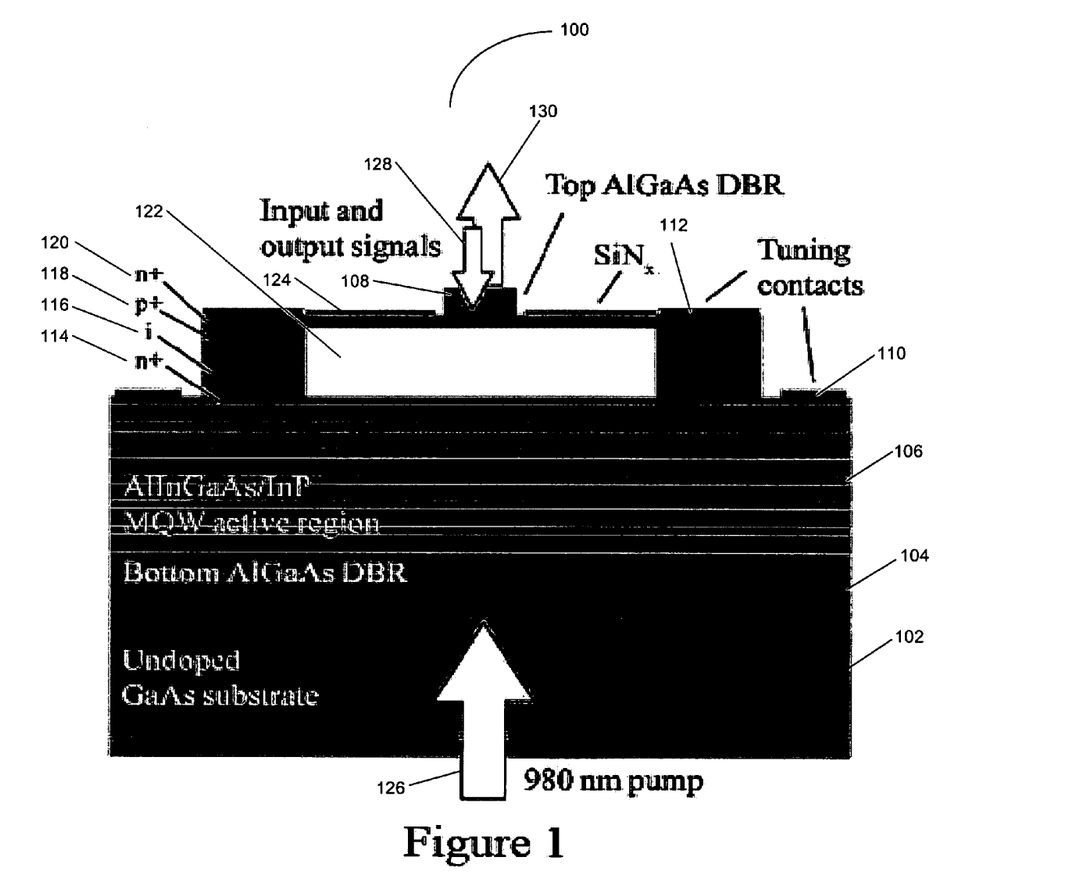
FIG. 1 illustrates a schematic cross-section of one implementation of the MEMS-tunable VCSOA (MT-VCSOA) of the present invention.

FIG. 1 illustrates a schematic cross-section of one implementation of the MEMS-tunable VCSOA (MT-VCSOA) of the present invention.

Device 100 of the present invention typically comprises substrate 102, lower DBR stack 104, active region 106, upper DBR stack 108, contacts 110 and 112, and layers 114, 116, 118, and 120.

Typically, the device 100 is constructed on an undoped Gallium Arsenide (GaAs) substrate 100, but other materials can be used for substrate 100 if desired. The lower DBR stack 104 is then deposited or bonded on substrate 100, and the active region 106 is deposited or bonded on the lower DBR stack 104. As shown in FIG. 1, the active region is an Aluminum Indium Gallium Arsenide/Indium Phosphide (AlInGaAs/InP) Multiple Quantum Well (MQW) structure, but other materials and/or structures can be used without departing from the scope of the present invention. As with lower DBR stack 104, upper DBR stack 108, which includes layers 114, 116, 118, and 120, is an AlGaAs structure, but can be other materials without departing from the scope of the present invention. The upper DBR stack layer 114 is deposited on the active region 106, but rather than repeating the periodic interleaving of the high and low refractive index layers of the DBR structure, an air gap is introduced. The DBR structure typically has a repetition of high and low index layers, and in the device of the present invention, one of the low index layers is replaced with an air gap where the air gap allows for a variation in the effective cavity length of the device which allows for tuning of the device. The intrinsic AlGaAs layer is used both as a sacrificial etch material to be removed to form the air gap, and also as a current blocking layer in the MEMS actuator structure which is basically a capacitor. The thickness of intrinsic layer 116 defines the tuning range of the device 100. After the intrinsic layer 116, and layers 118 and 120 are deposited, an etch takes place to create an air gap 122, which allows layers 118 and 120 to flex downward into air gap 122, which brings upper DBR stack 108 closer to the active region 106. A Silicon Nitride (SiNx) layer 124, also called a stiffener, is deposited on the top of layer 120, to provide tension to the layers 118 and 120, and a starting point (or uniform static state) for the upper DBR stack 108.

The contacts 110 and 112 are deposited, on the top of layers 114 and 120, respectively. When a voltage is applied between contacts 110 and 112, the upper DBR stack is moved closer to the active region 106, and the air gap 122 thickness is reduced.

The device 100 is pumped optically by a pump input 126, and an optical input signal 128 is supplied through the upper DBR 108. The optical output 130 is provided through the upper DBR stack 108 as well. Although shown as an optical pump 126, device 100 can be electrically pumped if desired without departing from the scope of the present invention. The MT-VCSOA device 100 of the present invention operates in reflection mode. However, transmission mode operation, where the signal exits the MT-VCSOA through the opposite mirror from which it was input, is also possible through a suitable variation in the reflectivity of the DBR stacks.

Operation of the MT-VCSOA

To achieve wide wavelength tuning of the VCSOA cavity mode, a micromachined electrostatic actuator, comprising layers 114-120 and contacts 110 and 112, is integrated into the device 100 in order to physically alter the thickness of air gap 122 in the upper DBR stack 108. Depending on the actuator configuration, the air gap 122 thickness may be increased or decreased from its initial position. With an increase (decrease) in the air gap 122 thickness, the effective cavity length is increased (decreased) and the cavity resonance wavelength is red (blue) shifted.

As shown in FIG. 1, a reverse bias across the tuning contacts 110 and 112 creates an electrostatic force that results in the displacement of the layer 120 towards substrate 102, reducing the air gap 122 thickness and blue shifting the resonant wavelength of the device 100. Other actuators can be made that move upper DBR stack 108 away from the substrate 102, which would red shift the resonant wavelength of device 100. As various voltages are applied across the tuning contacts 110 and 112, the upper DBR stack 108 moves different distances toward or away from the substrate 102, and the lower DBR stack 104, which changes the resonating frequency of device 100.

Tuning Ranges

Figure 2:
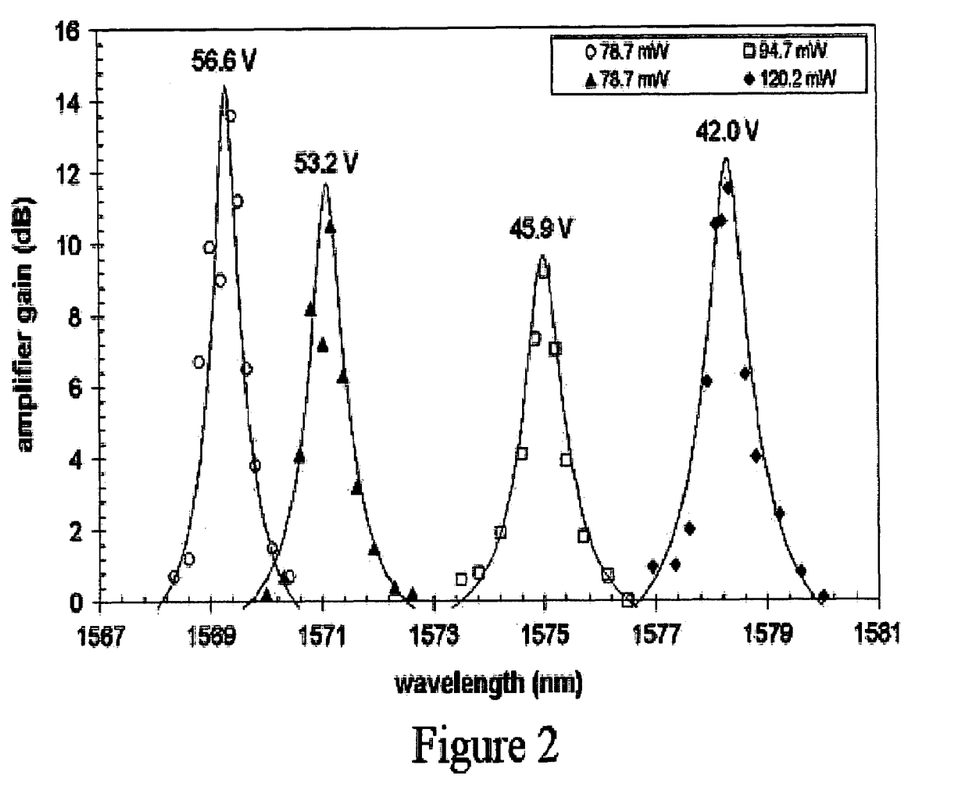
FIG. 2 illustrates tuning ranges of the device of the present invention.

FIG. 2 illustrates tuning ranges of the device of the present invention.

The MT-VCSOA gain spectrum at multiple tuning bias values is illustrated in FIG. 2. The amplifier demonstrates a minimum of 10 dB device gain over 11 nm of tuning. FIG. 2 further illustrates that while the gain level is wavelength dependent, it can be kept constant by adjusting the optical pump 126 power.

MT-VCSOA

Figure 3:
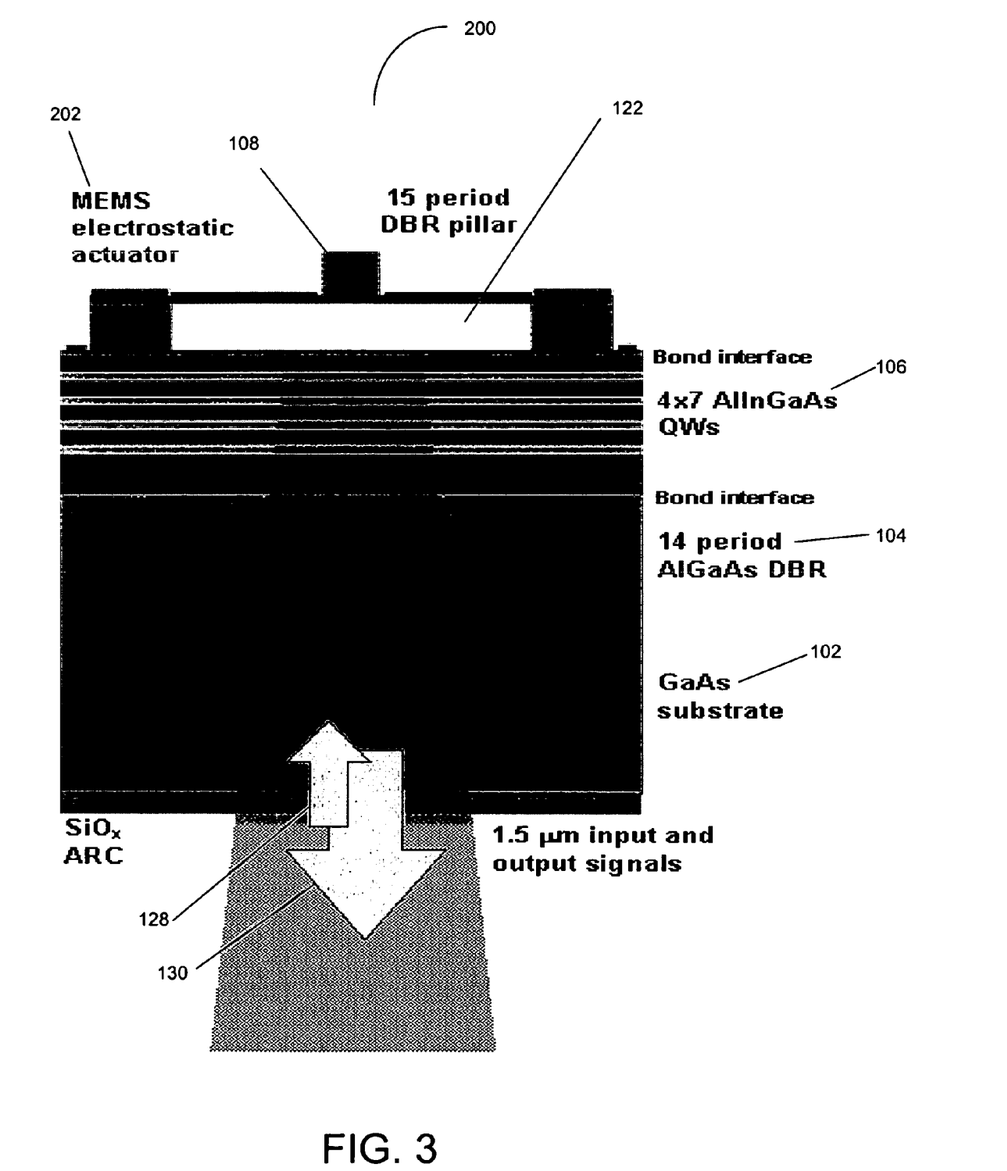
FIG. 3 illustrates a device in accordance with the present invention where the optical input and output are through the bottom of the device.

FIG. 3 illustrates a device 200 in accordance with the present invention where the optical input and output are through the bottom of the device.

With VCSOAs the properties of the mirrors used in the resonant cavity structure are crucial in determining the characteristics of the amplifier, including the gain, bandwidth, saturation, and noise figure. When the upper DBR stack 108 (which is tuned using the MEMS actuator 202 as the MEMS tunable DBR mirror) is used as the transmissive mirror, a significant roll off in the effective mirror reflectance with tuning is observed. Over the wavelength tuning range of the MT-VCSOA device, the variation in reflectance of the upper DBR mirror stack 108 may be extremely large when using the MEMS tunable mirror structure 108 as the transmissive mirror. As compared with the mirror requirements in a vertical-cavity surface-emitting laser (VCSEL), the lower reflectance values necessary with the VCSOA lead to a much larger change in mirror reflectance as the air gap 122 is varied from its ideal thickness. In this case the roll-off in tunable mirror reflectance will greatly diminish the wavelength span over which acceptable amplification may be achieved.

In the MT-VCSOA the variation in reflectance with tuning is caused by the changing magnitude of interference from the multiple reflections within the air gap 122 cavity. When the air gap 122 is near a thickness of an odd multiple of $\lambda_c/4$, the reflections from the cavity/air interface and the membrane DBR structure add in phase and result in a maximum in the effective reflectance of the tunable mirror structure ($R_{eff}$). When the air gap reaches a thickness of a multiple of $\lambda_c/2$, destructive interference occurs and $R_{eff}$ reaches a minimum value. From the perspective of the semiconductor cavity, the destructive interference leads to a reduced mirror reflectance as the air-gap 122 thickness is deviated from its ideal value. With insufficient reflectance the mirror loss leads to a significant reduction in the VCSOA signal gain.

Tunable Cavity Design

Figure 4A:
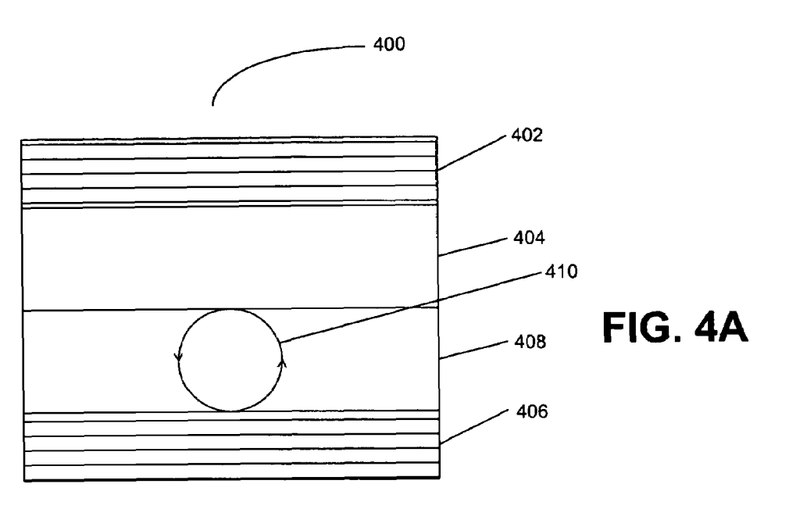
FIGS. 4(a) and 4(b) illustrate the semiconductor-coupled cavity (SCC) and extended-cavity (EC) designs of a MT-VCSOA in accordance with the present invention.
Figure 4B:
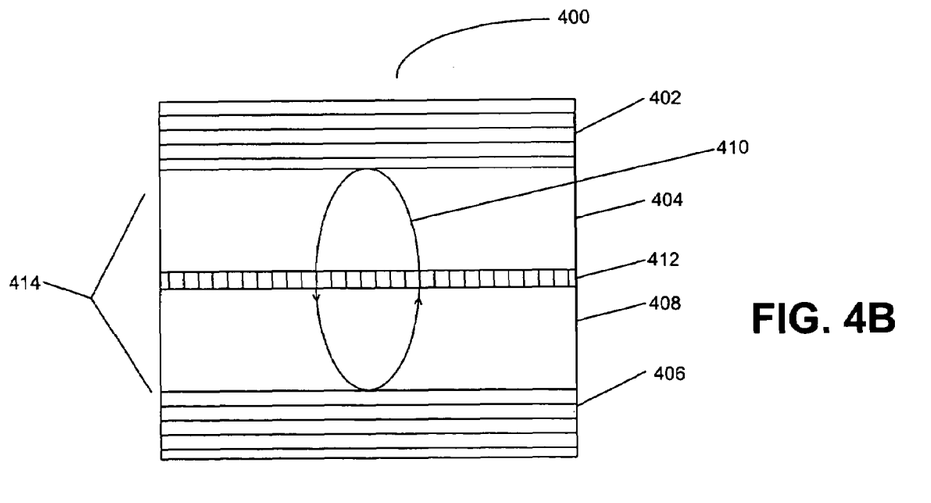

FIGS. 4(a) and 4(b) illustrate the semiconductor-coupled cavity (SCC) and extended-cavity (EC) designs of a MT-VCSOA in accordance with the present invention.

In addition to standing wave effects, the short cavity length of the VCSOA 400 leads to an inherently large axial mode spacing. Because of this fact, continuous mode-hop-free tuning is achievable over a relatively wide wavelength span. To realize wavelength tuning of the device, we use a MEMS-based optical cavity design similar to that used in tunable VCSELS, RCLEDs and photodetectors. These devices contain a variable-thickness air gap within the resonant cavity structure that allows for variation of the effective cavity length. With a MEMS-tunable vertical-cavity device, there exist a number of distinct optical cavity structures. These structures include the semiconductor-coupled cavity (SCC) and extended-cavity (EC) designs. Each design incorporates an air gap within the optical cavity, as described in FIGS. 4(a) and 4(b). By modulating the thickness of this air gap, the resonant wavelength of the cavity may be tuned.

For these structures, the suspended mirror 402 is defined as the membrane DBR 402 and the combination of the membrane DBR 402 and air gap 404 is referred to as the tunable mirror structure. The top mirror 402 and bottom mirror 406 are designed to give a π phase shift at the center wavelength of the cavity 408 $\lambda_C$, which is defined as the wavelength at which the air gap 404 is of the ideal thickness and the DBRs 402 and 406 meet the Bragg condition. For the following, all lengths are given as optical thickness-physical thickness multiplied by the refractive index.

1) SCC Design

The SCC design, as seen in FIG. 4(a), utilizes a semiconductor cavity 408 containing the active material of length a multiple of $\lambda_C/2$, along with an air gap 404 of thickness near an odd multiple of $\lambda_C/4$. In this design, the air gap acts as a low index layer of the top DBR 402. The large index step afforded by the air gap 404 allows for enhanced reflectance of the tunable mirror 402 structure, as well as maximum overlap of the optical field with the active region 408. With the SCC design, the increased optical overlap is achieved at the expense of a decreased wavelength tuning efficiency, resulting in a small wavelength shift for a given change in air-gap 404 thickness. In a tunable vertical-cavity amplifier, the tradeoff of decreased tuning range for increased optical overlap may be preferred, as it is necessary to achieve the highest possible single-pass gain in these devices. In this design, the coupling between the air gap 404 and semiconductor active region 408 leads to complications in the tuning mechanism. These complications include changes in the top mirror 402 reflectance and confinement factor with tuning, which may lead to variations in the peak gain, bandwidth, saturation, and Noise Figure (NF) over the wavelength tuning range of the amplifier. Depending on the final application, the benefits of the SCC design, including maximum overlap of the optical field with the active material and enhanced top mirror reflectance, may outweigh the resulting tradeoff of a limited tuning response. In addition, the SCC design is simple to implement, as there is no need to access the optical cavity to create the antireflection coating (ARC) necessary in the EC design. The resonance 410 occurs within the active region 406 in the SCC design.

2) EC Design

As shown in FIG. 4(b), by placing an ARC 412 within the cavity, at the interface between the semiconductor active region 408 and the variable air gap 404, the EC structure is produced. Here, the combination of the active region and air gap produces an "extended cavity" 414 of a total thickness of a multiple of $\lambda_C/2$. In this design, the ARC 412 may be fabricated using a simple quarter-wave transformer, with a refractive index value equal to the square root of the active-region 408 refractive index. The EC design allows for increased wavelength tuning ranges when compared to the SCC design, and the tuning response of the EC design is linear, as a function of air-gap 404 thickness, over a relatively wide wavelength range (DBR 402, 406 stop band as well as ARC 412 bandwidth limits the linear tuning range). However, the larger achievable tuning range comes at the expense of reduced optical overlap with the stacked MQW active region 408. Thus, given a similar active region 408 and mirror 402, 406 design, the EC structure will exhibit reduced peak gain for a given value of material gain, when compared to the SCC structure. Due to the presence of the ARC 412 in the structure, coupled cavity effects are suppressed and more constant gain profiles will result over the wavelength tuning range of the device. Assuming an ideal ARC 412, the variations in device properties found with tuning will be caused by the wavelength shift of the cavity 408, as well as those changes brought about by the variation in the total cavity 408 length.

D. Wavelength Tuning

In each of the optical cavity designs described above, the air gap allows for wavelength tuning through the variation in the effective cavity length of the device. Using a Fabry-Perot (FP) based analytical model, the tunable mirror structure can be described using the standard relationships for a FP interferometer. The effective reflectance of the tunable mirror structure may be written as $$R_{EFF} = \frac{R_C + R_M - 2\sqrt{R_C R_M} \cos(\phi_G)}{1 + R_C R_M - 2\sqrt{R_C R_M} \cos(\phi_G)}$$

where $R_M$ is the power reflectance of the membrane DBR, RC is the reflectance of the interface between the semiconductor cavity and the air gap, $\Phi G$ is the round-trip phase in the air gap=

$$2\beta_G L_G + 2(\beta_G - \beta_{G0}) L_M$$

with $\beta_G = 2\pi/\lambda$, $\beta_{G0} = 2\pi/\lambda_C$, $L_M$ is the penetration depth into the membrane DBR, and $L_G$ is the thickness of the air gap.

Similarly, the reflected phase is given by the relation $$\phi_{EFF} = \tan^{-1} \frac{\sqrt{R_M}\,(R_C - 1)\sin(\phi_G)}{\sqrt{R_C}\,(1 + R_M) - \sqrt{R_M}\,(1 + R_C)\cos(\phi_G)}$$

From the reflectance equation above, the reflectance of the tunable mirror structure varies with the round-trip phase in the air gap. Most notably, with the SCC design the effective reflectance will be reduced with tuning due to phase interference from multiple reflections within the air-cavity structure. When the air gap is near a thickness of an odd multiple of $\lambda_C/4$, the multiple reflections add in phase and result in a maximum in $R_{eff}$. When the air gap reaches a thickness of a multiple of $\lambda_C/2$, destructive interference occurs and the reflectance reaches a minimum value.

With the EC design, the presence of the ARC removes the fixed phase reflection from the bottom of the air gap and, assuming an ideal ARC, resulting in a constant tunable mirror reflectance over the tuning range of the VCSOA, assuming this falls within the stop band of the DBR mirrors and the ARC bandwidth.

Continuing with the FP approach, we may describe the wavelength-tuning characteristics of the SCC design by treating the air gap-DBR structure as a mirror with a tunable phase shift. The resonant wavelength of the optical cavity occurs when the round trip phase of the semiconductor cavity and the DBRs (including the contribution of the air gap in the top mirror) is equal to an integer multiple of $2\pi$. For small changes centered on the ideal air-gap thickness, the shift in wavelength of the resonant cavity mode corresponding to a given change in air-gap thickness is given by $$\frac{\Delta\lambda}{\lambda_C} = \frac{\gamma_\phi \Delta L_G}{L_B + L_{SC} + \gamma_\phi(L_G + L_M)}$$

with the phase coupling factor $\gamma_\phi = d\Phi_{EFF}/d\Phi_G$.

The denominator describes the total cavity length of the device, including the penetration depth into the bottom DBR $L_B$, the length of the semiconductor cavity $L_{SC}$, and the effective length of the tunable mirror structure, which is the sum of the air-gap thickness $L_G$ and the penetration depth into the membrane DBR $L_M$, scaled by $\gamma_{101}$.

The wavelength shift of SCC design is directly proportional to the phase coupling factor, thus, for a given change in air-gap thickness, a device with a large $\gamma_\phi$ will exhibit a larger wavelength tuning rate. Within a linear tuning regime, the small value of the phase coupling factor reduces the effects of tilt or additional loss that may be caused by nonuniformity of the membrane DBR, by reducing the total penetration depth of the optical field into the tunable mirror structure. However, for large membrane displacements, the phase coupling factor will increase dramatically. For the EC design, if the active region-air interface contains an ideal ARC, $\gamma_\phi$ becomes unity, and the tuning response is directly related to the change in air-gap thickness; note that this linear tuning regime for the EC structure will be limited by the finite width of the DBR stopband, as well as the bandwidth of the ARC. Because of the increase in $\gamma_\phi$ as compared to the SCC design, the EC structure is more sensitive to imperfections in the membrane DBR.

Signal Gain of MEMS-Tunable VCSOAs

From the relationships presented above, it is possible to derive expressions describing the effects of the tunable mirror structure on the peak gain of the VCSOA. The peak signal gain of a reflection mode SCC-design tunable VCSOA may be written as $$G_R = \frac{\left(\sqrt{R_{EFF}} - g_s\right)^2}{\left(1 - \sqrt{R_{EFF}}\, g_s\right)^2}$$

Where $G_R$=the reflective gain, and $g_S$ is the single pass gain, and where the device contains a highly reflective fixed mirror and a slightly transmissive membrane DBR. This expression shows that the peak gain is dependent on the effective reflectance of the tunable mirror structure, which is a function of the membrane reflectance, the cavity-air interface reflectance and the round trip phase of the air gap.

Another option for the SCC-design reflection-mode tunable VCSOA would be to use the tunable mirror structure as the highly reflective mirror. By using the MEMS tuning structure as the highly reflective mirror in the reflection-mode SCC-design VCSOA, the peak gain relationship becomes independent of both the reflectance of the cavity-air interface and the round-trip phase of the air gap. In this configuration, the MEMS-tuning element may be described as a Gires-Tournois interferometer, which is essentially an FP interferometer with a unity back reflector. This same expression can be used to model the reflection mode EC-design tunable VCSOA.

With a transmission-mode VCSOA, the peak transmission gain is dependent on the reflectance of the cavity-air interface and both DBRs, as well as the round-trip phase in the air gap. The changing mirror reflectance with tuning may be suppressed by employing the EC structure in these devices. Again, assuming an ideal ARC, where RC~0, the peak gain for a transmission-mode VCSOA using the EC design reduces to the standard expression with the membrane mirror reflectance replacing either the top or bottom mirror reflectance, depending on the configuration of the structure.

Electrostatic Actuation

Figure 5:
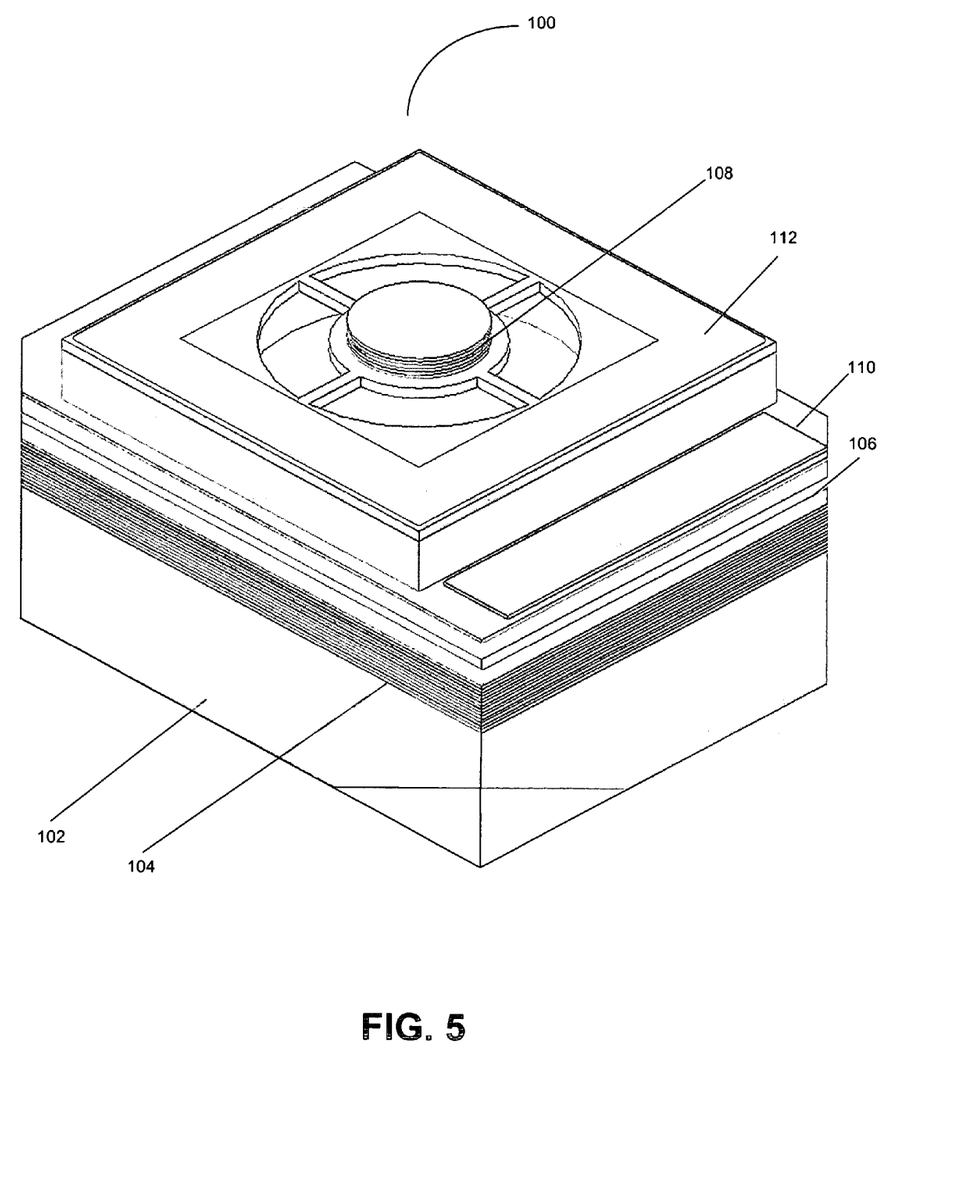
FIG. 5 illustrates a perspective view of a MT-VCSOA in accordance with the present invention.

FIG. 5 illustrates a perspective view of a MT-VCSOA in accordance with the present invention.

To achieve wide wavelength tuning of the VCSOA cavity mode, it is necessary to construct a mechanical system to physically alter the thickness of the air gap. The most efficient realization of such a structure involves the use of an integrated micromechanical actuator. Depending on the configuration of the actuator, the air-gap thickness may be increased or decreased from its initial position. With an increase (decrease) in the air-gap thickness, the effective cavity length is increased (decreased) and the cavity resonance wavelength is red (blue) shifted. Using a MEMS-based tuning element, various actuator designs are possible; the most commonly used being electrostatic and thermal actuators. A schematic of the MT-VCSOA is included as FIG. 5.

For a low-power high-speed tuning response, the most effective actuator design is the integrated electrostatic actuator. In its simplest form, the electrostatic actuator consists of a pair of parallel capacitor plates separated by an air gap of a specified thickness, in which one or more of the plates is freely suspended. With an applied bias, the Coulomb force is exerted on the plates due to the charge separation present. If one, or both, of the plates is free to move, then the electrostatic force results in a change in the air-gap thickness, leading to a variation in the effective cavity length of the VCSOA. Because the air gap is an integral part of the resonant cavity, the thickness will be constrained by the optical design of the device.

Because the electrostatic force itself is a function of the displacement, an iterative solution must be used to determine the equilibrium deflection of the actuator. More advanced modeling techniques to describe the mechanical properties of the MEMS structure include the area-moment method or full three-dimensional (3-D) models using finite-element analysis.

Variations in Reflectance

Figure 6:
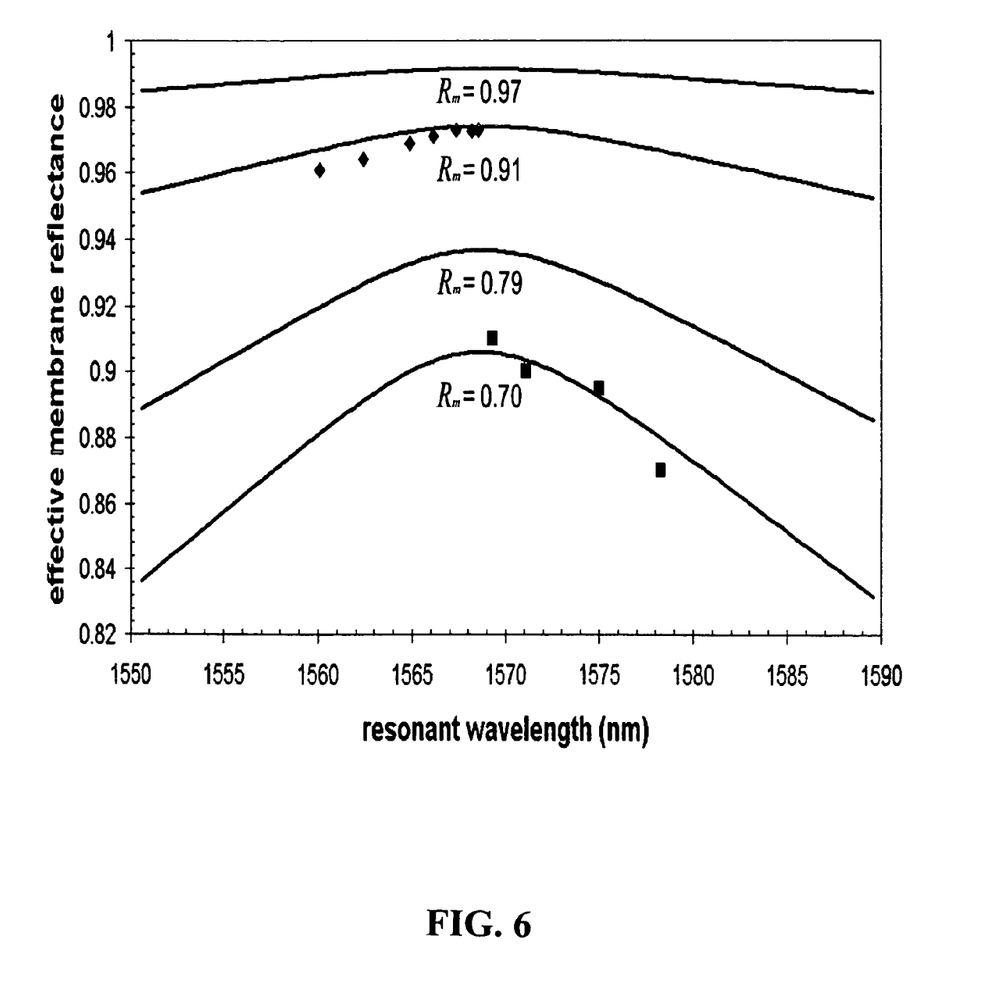
FIG. 6 illustrates the theoretical curves for the variation in reflectance of the tunable mirror structure.

FIG. 6 illustrates the theoretical curves for the variation in reflectance of the tunable mirror structure.

Using theoretical models it is possible to plot the effective reflectance of the tunable mirror structure 100 as a function of the resonant wavelength of the VCSOA, as shown in FIG. 6, where $R_m$ is the power reflectance of the upper DBR stack 108 (also called the membrane DBR). This plot includes data from devices 100 with both a 4-period and 5-period upper DBR stack 108 pillar.

For the 4-period upper DBR stack 108 pillar the measured peak reflectance value is 0.91 at 1569.3 nm, and drops to 0.87 at a wavelength of 1578.3 nm. In this device 100, the measured maximum reflectance is much lower than the theoretically calculated peak value of 0.968, and is attributed to additional mirror loss brought about by the wet chemical etching process used to remove one of the mirror periods. For the 5 period upper DBR stack 108 sample, the peak reflectance of 0.974 matches well with predicted value of 0.976. With increasing peak mirror reflectance the roll off in $R_{eff}$ becomes much less severe. With roughly 20 nm of tuning from the peak reflectance wavelength, the theoretical reflectance drops to 0.953 at 1550 nm for the 5-period structure. As the limit of the membrane DBR reflectance, $R_m=1.00$, is approached, the effective tunable mirror reflectance reduces to unity, and becomes independent of the phase detuning of the air gap.

Figure 7:
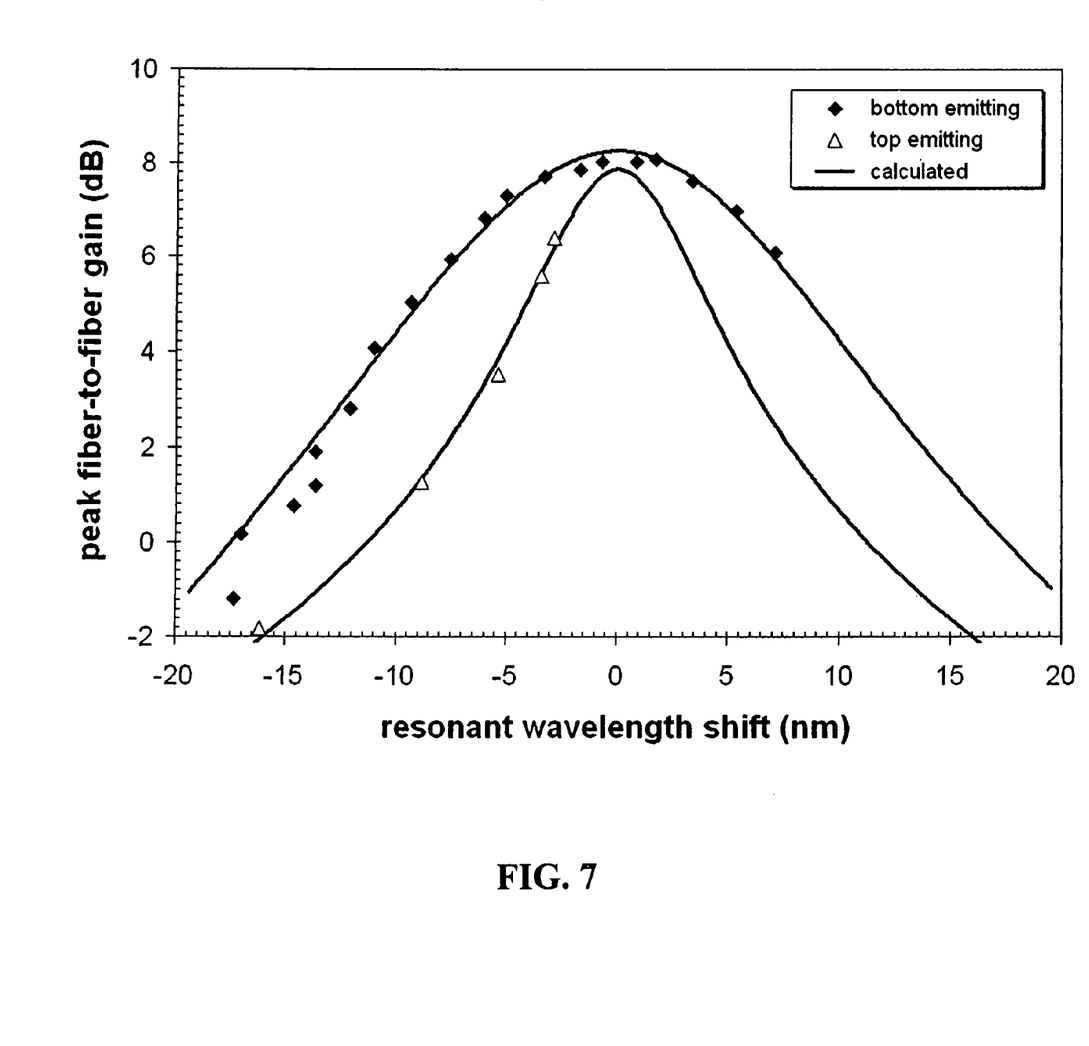
FIG. 7 illustrates a comparison of the resonant wavelength shift of a top emitting device of the present invention and a bottom emitting device of the present invention.

FIG. 7 illustrates a comparison of the resonant wavelength shift of a top emitting device of the present invention and a bottom emitting device of the present invention.

Figure 8:
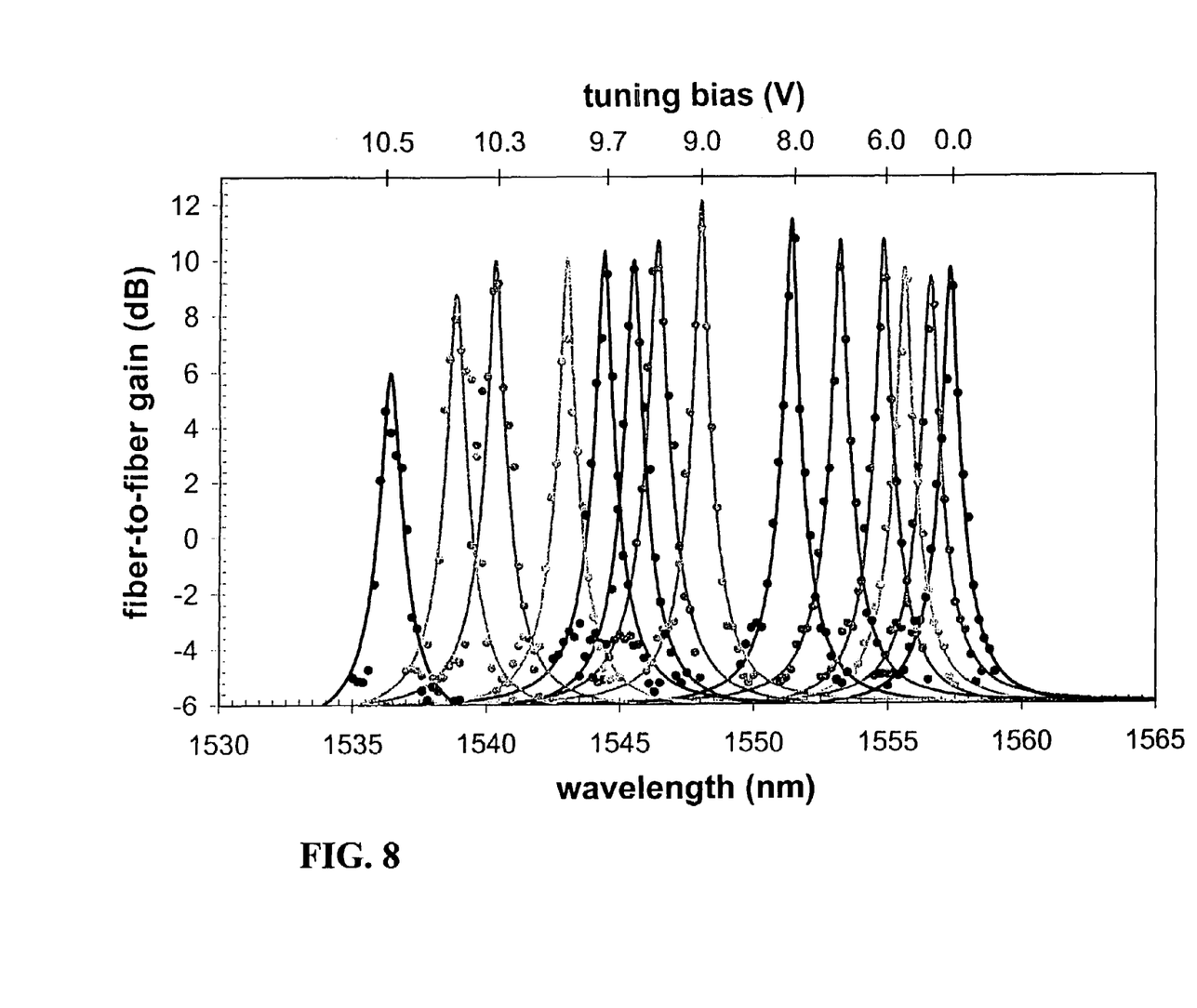
FIG. 8 illustrates additional gain spectra results of the present invention.

The major limitation to the wavelength range over which sufficient signal gain may be achieved arises from the roll off in mirror reflectance with tuning. To overcome this limitation, the device of FIG. 3, which uses a highly reflective MEMS tunable DBR stack 108 mirror, and the fixed bottom DBR 104 be used as the transimissive mirror in reflection mode MT-VCSOAs. The bottom emitting devices 200 present more constant amplifier properties with tuning, as well as an extended wavelength range over which acceptable signal gain may be recorded. FIG. 8 illustrates additional gain results of devices manufactured in accordance with the present invention.

APPENDICES

The following articles are additional descriptions of portions of the present invention and are herein incorporated by reference:

"MEMS-Tunable Vertical-Cavity SOAs," IEEE *Journal of Quantum Electronics*, Vol. 41, No. 3, March 2005.

"First Demonstration of a MEMS Tunable Vertical-Cavity SOA," *IEEE Photonics Technology Letters*, Vol. 16, No. 6, June 2004.

"MEMS enhance SOA tuning range," R&D Highlights, *Fibers.org*, December 2004.

"Light Booster," Prototype, *Technology Review*, September 2004.

"MEMS make SOAs tune farther and faster," *Fibers.org*, 17 Aug., 2004.

"Long-Wavelength Vertical-Cavity Semiconductor Optical Amplifiers" E. Staffan Bjorlin, December, 2003.

"Carrier-Confined Vertical-cavity Semiconductor Optical Amplifiers for Higher Gain and Efficiency," IEEE Journal of Selected Topics in Quantum Electronics, Vol. 9, No. 5, September/October 2003.

G. D. Cole, E. S. Bjorlin, C. S. Wang, N. C. MacDonald, J. E. Bowers, "Widely tunable bottom-emitting vertical-cavity SOAs," IEEE Photonics Technology Letters, vol. 17, no. 12, December 2005, pp. 2526-2528.

CONCLUSION

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture and use of the apparatus and method of the invention.

What is claimed is:

1. A tunable semiconductor optical amplifier (SOA), comprising:
   a substrate;
   a first mirror, coupled to the substrate;
   a second mirror;
   an active region, coupled between the first and second mirror, wherein an optical input is received into the active region and the active region comprises a multiple quantum well structure wherein twice a single-pass gain is insufficient to overcome a cavity loss in the tunable SOA, and a microelectromechanical actuator, coupled to the second mirror, the microelectromechanical actuator receiving a voltage and tuning the semiconductor optical amplifier (SOA) with the voltage wherein the semiconductor optical amplifier (SOA) amplifies the optical input into an optical output.

2. The tunable semiconductor optical amplifier (SOA) of claim 1, wherein the optical input of the tunable SOA is from the substrate.

3. The tunable semiconductor optical amplifier of claim 2, further comprising a stiffener, coupled to the microelectromechanical actuator, for creating a uniform static state of the tunable SOA.

4. The tunable semiconductor optical amplifier of claim 3, wherein the substrate is gallium arsenide.

5. The tunable semiconductor optical amplifier (SOA) of claim 1, wherein an optical output of the tunable SOA is from the second mirror.

6. The tunable semiconductor optical amplifier (SOA) of claim 1, wherein the optical output of the tunable SOA is from the substrate.

7. The tunable semiconductor optical amplifier of claim 1, further comprising a stiffener, coupled to the microelectromechanical actuator, for creating a uniform static state of the tunable SOA.

8. The tunable semiconductor optical amplifier of claim 1, wherein the substrate is gallium arsenide.

9. A tunable semiconductor optical amplifier (SOA), comprising:
    a substrate;
    a first mirror, coupled to the substrate;
    an active region coupled to the first mirror, the active region comprising a multiple quantum well structure wherein twice a single-pass gain is insufficient to overcome a cavity loss in the tunable SOA;
    at least one layer of a second mirror coupled to the active region, wherein an optical input is received into the active region;
    a microelectromechanical actuator, coupled to the at least one layer; and
    a remainder of the second mirror, coupled to the microelectromechanical actuator, a voltage being applied to the microelectromechanical actuator to move the remainder of the second mirror and tune the semiconductor optical amplifier (SOA) with the voltage wherein the semiconductor optical amplifier (SOA) amplifies the optical input into an optical output.

10. The tunable semiconductor optical amplifier (SOA) of claim 9, wherein the optical input of the tunable SOA is from the substrate.

11. The tunable semiconductor optical amplifier of claim 10, further comprising a stiffener, coupled to the microelectromechanical actuator, for creating a uniform static state of the tunable SOA.

12. The tunable semiconductor optical amplifier of claim 11, wherein the substrate is gallium arsenide.

13. The tunable semiconductor optical amplifier (SOA) of claim 9, wherein an optical output of the tunable SOA is from the second mirror.

14. The tunable semiconductor optical amplifier (SOA) of claim 9, wherein the optical output of the tunable SOA is from the substrate.

15. The tunable semiconductor optical amplifier of claim 9, further comprising a stiffener, coupled to the microelectromechanical actuator, for creating a uniform static state of the tunable SOA.

16. The tunable semiconductor optical amplifier of claim 9, wherein the substrate is gallium arsenide.

17. The tunable semiconductor optical amplifier (SOA) of claim 1, wherein the optical input of the tunable SOA is from the second mirror.

18. The tunable semiconductor optical amplifier (SOA) of claim 9, wherein the optical input of the tunable SOA is from the second mirror.

* * * * *